United States Patent [19]

Ford et al.

[11] Patent Number: 5,272,641
[45] Date of Patent: Dec. 21, 1993

[54] PARTS INSERTION MACHINE CONTROL SYSTEM

[75] Inventors: Michael Ford; Yoshikazu Oto; Fusako Miyashita, all of Tokyo, Japan

[73] Assignee: Sony Corporation, Tokyo, Japan

[21] Appl. No.: 748,870

[22] Filed: Aug. 23, 1991

[30] Foreign Application Priority Data

Aug. 30, 1990 [JP] Japan .................. 2-229469

[51] Int. Cl.⁵ .................................................. G06F 15/46
[52] U.S. Cl. .................................. 364/468; 364/132
[58] Field of Search .......................... 364/131–136, 364/138, 139, 468, 478, 401, 402, 403, 488–491, 474.11; 395/82, 83, 84; 29/701, 709, 711, 739, 740, 741

[56] References Cited

U.S. PATENT DOCUMENTS

| 4,681,452 | 7/1987 | Watanabe .................. 364/468 X |
| 4,759,123 | 7/1988 | Ohta et al. ................. 364/468 X |
| 4,870,591 | 9/1989 | Cicciarelli et al. .............. 364/468 |
| 4,890,241 | 12/1989 | Hoffman et al. ............... 395/84 X |

FOREIGN PATENT DOCUMENTS 0331478 9/1989 European Pat. Off. ............ 364/468

OTHER PUBLICATIONS

European Search Report EP Application No. 91307926 dated Jan. 8, 1992.
W. Jillek, *CAD/CAM-kopplung fur die Bestuckung von Leiterplatten*, Feinwerktechnik & Messtechnik, vol. 95, No. 2, Mar. 1987, pp. 81–85.
Von Jurgen Hesselbach, *Roboter in flexiblen Montagesystemen*, VDI-Zeitschrift, vol. 131, No. 8, Aug. 1989, pp. 88–92.

*Primary Examiner*—Joseph Ruggiero
*Attorney, Agent, or Firm*—Lewis H. Eslinger; Jay H. Miaoli

[57] ABSTRACT

A control system for automatic parts insertion machines. The control system comprises a plurality of parts insertion machines installed in local factories, local computers for directly controlling the parts insertion machines, a central computer installed in a control center, a parts list control system for supplying part data to the central computer, a CAD system for designing a printed circuit board and supplying CAD data to the central computer, and a communication network for connecting the central computer and said local computers through signal lines.

1 Claim, 5 Drawing Sheets

FIG. 2A

LOAD PLAN

MODEL :
BOARD :
TYPE :
STEP :

VERSION :
START :
END :
TIME :

USER :
MACHINE :
EFFICIENCY :

| FEED | PARTS NUMBER | QUANT | DESCRIPTION | CASSETTE TYPE | SENSE DATA | PROFILE DIRECTION |
|------|--------------|-------|-------------|---------------|------------|-------------------|
|      |              |       |             |               |            |                   |

FIG. 2B

STORE PLAN

MODEL :
BOARD :
TYPE :
STEP :

VERSION :
START :
END :
TIME :

USER :
MACHINE :
EFFICIENCY :

| PARTS NUMBER | FEED | PROFILE DIRECTION | QUANT | DESCRIPTION | CASSETTE TYPE | REEL DIAM | TAPE WIDTH | TAPE PITCH | TAPE MATERIAL |
|--------------|------|-------------------|-------|-------------|---------------|-----------|------------|------------|---------------|
|              |      |                   |       |             |               |           |            |            |               |

FIG. 2C

SEQUENCE LIST

MODEL :
BOARD :
TYPE :
STEP :

VERSION :
START :
END :
TIME :

USER :
MACHINE :
EFFICIENCY :

| BLOCK | REF | PROFILE DIRECTION | PARTS NUMBER | DESCRIPTION | INSERTION DATA | CASSETTE TYPE |
|-------|-----|-------------------|--------------|-------------|----------------|---------------|
|       |     |                   |              |             |                |               |

PARTS INSERTION MACHINE CONTROL SYSTEM

BACKGROUND OF THE INVENTION

This invention relates to a control system for automatic parts insertion machines.

Automatic parts insertion machines have been used widely to insert electric parts into a printed circuit board. Such automatic insertion machines include a table having a printed circuit board fixedly supported thereon, and a head movable for transferring an electric part from a cassette to a specified position on the printed circuit board. An automatic insertion program is used to control the operation of the automatic insertion machine. It is the conventional practice to create the automatic insertion program manually after the printed circuit boards are delivered in the factory. One of the difficulties encountered with the conventional practice is that the lead time is very long. Three or five days are required to create the automatic insertion program after necessary data are obtained. The operator(s) should be well experienced in the field of automatic insertion production to create an automatic insertion program leading to a high automatic insertion efficiency. In addition, the fundamental data necessary to create an automatic insertion program must be entered manually through a keyboard. The manual entry of data requires much time, introduces errors and increases the lead time. Finally, it takes much time and labor to make program design changes so as to accommodate new types of automatic insertion machines.

SUMMARY OF THE INVENTION

Therefore, it is a main object of the invention to provide a user-friendly and production-orientated parts insertion machine control system which can create automatic insertion programs with ease.

There is provided, in accordance with the invention, a control system for parts insertion machines. The control system comprises a plurality of parts insertion machines installed in local factories, local computers for directly controlling the parts insertion machines, a central computer installed in a control center, a parts list control system for supplying parts data to the central computer, a CAD system for designing a printed circuit board and supplying CAD data to the central computer, and a communication network for connecting the central computer and the local computers through signal lines.

BRIEF DESCRIPTION OF THE DRAWINGS

This invention will be described in greater detail by reference to the following description taken in connection with the accompanying drawings, in which:

FIGS. 2A, 2B and 2C are diagrams showing documents to be printed in accordance with the invention;

DETAILED DESCRIPTION OF THE INVENTION

Figure 1:
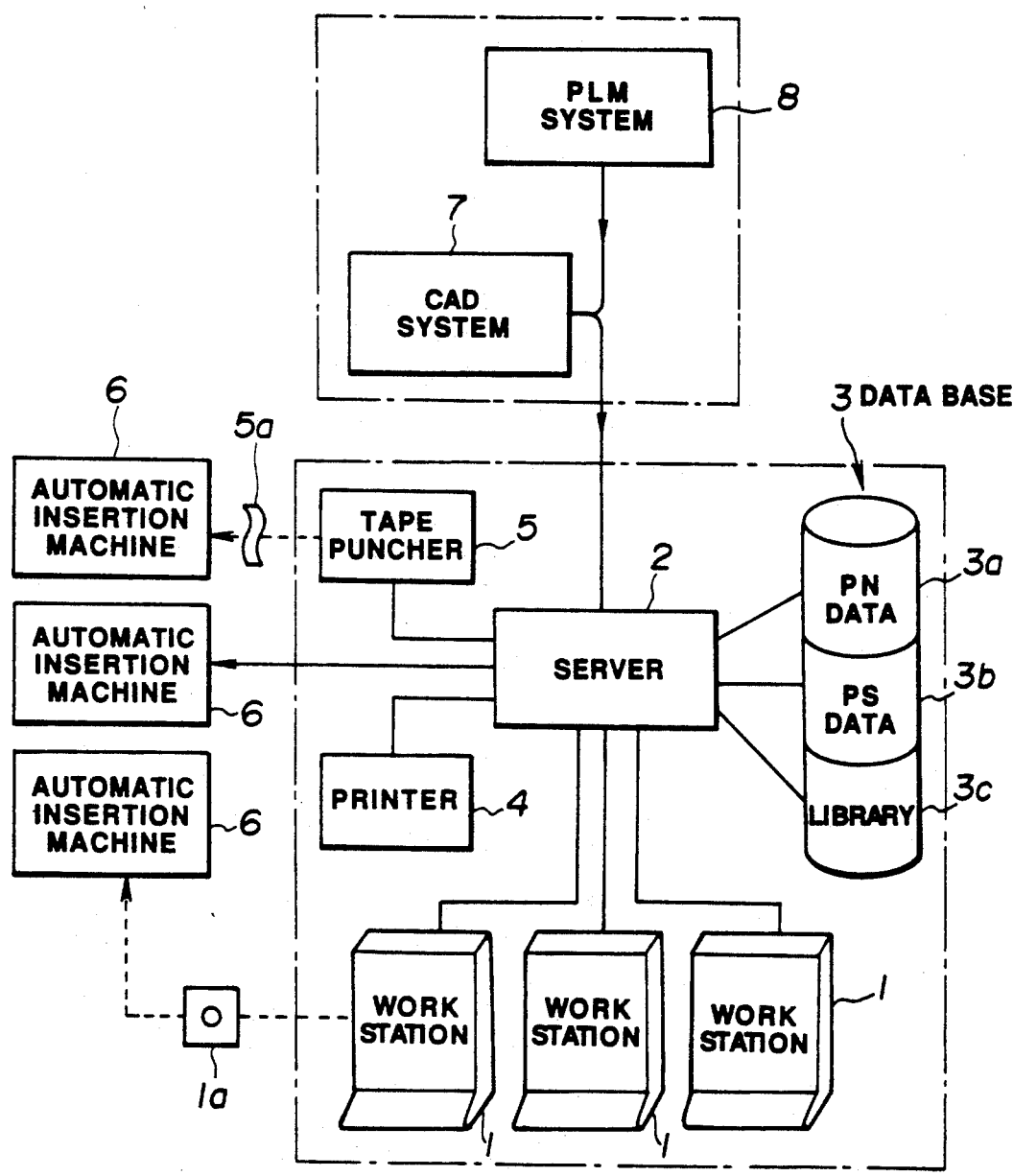
FIG. 1 is a schematic block diagram showing one embodiment of an apparatus for creating an automatic insertion program made in accordance with the invention.

With reference to the drawings, wherein like numerals refer to like components in the several views, and in particular to FIG. 1, there is shown a schematic block diagram of an automatic insertion programming system embodying the invention. The automatic insertion programming system includes a plurality of work stations 1 each employing a personal computer or the like for creating automatic insertion programs. The work stations 1 are connected to a server 2 which controls a data base 3, a printer 4 and a tape puncher 5 so that the work stations 1 can commonly use the data base 3, the printer 4 and the tape puncher 5 to provide multitask operation. Automatic insertion machines 6 are installed in different factories for automatic insertion of specified electric parts onto a printed circuit board. The automatic insertion machines 6 are operable according to the automatic insertion program created through the work stations 1.

The server 2 communicates with a computer aided design (CAD) system 7 used in designing the printed circuit board and also with a parts list managing (PLM) system 8 used to manage the electric parts and the printed circuit board. The CAD system 7 produces CAD data regarding the printed circuit board. For example, the CAD data includes data specifying the positions at which the respective electric parts are to be inserted on the printed circuit board. The PLM system 8 produces PLM data regarding the reference number assigned to the respective electric parts. For example, the PLM data include data specifying the specifications, profiles, packages and/or numbers of the respective electric parts indicated by the corresponding reference numbers. The fundamental data, that is, the CAD and PLM data, are referred to as interface file (IFF) data. The IFF data are transmitted through the server 2 into the data base 3. The IFF data may be transferred to the respective work stations through modems or through the medium of floppy discs.

The data base 3 includes a part number (PN) data memory section 3a, a part structure (PS) data memory section 3b, and a library memory section 3c. The PN data memory section 3a stores PN data including the PLM data. The PS data memory section 3b stores PS data including the CAD data. The library memory section 3c stores data regarding the automatic insertion machines 6 and algorithms used to create automatic insertion programs for the respective automatic insertion machines 6. The automatic insertion machine data and the algorithms are linked in a library form for use in each of the work stations 1 when the work station 1 creates an automatic insertion program used upon the PN and PS data.

The automatic insertion program created in one of the work stations 1 is transferred through the server 2 to the automatic insertion machine 6. Alternatively, the automatic insertion program may be transferred through the server 2 to the tape puncher 5 which produces a punched tape 5a for use in operating the automatic insertion machine 6. The automatic insertion program may be stored on a floppy disc 1a for use in operating the automatic insertion machine 6. Commands are produced to cause the printer 4 to print a load plan, a check mask and/or a sequence list. The load plan, shown in FIG. 2A, indicates which of the electric parts are placed in the respective cassettes provided for the automatic insertion machine 6. The store plan, shown in FIG. 2B, indicates the electric parts to be inserted on the printed circuit board. The check mask is used to check mistaken insertion of electric parts. The sequence list, shown in FIG. 2C, indicates the sequence of the automatic insertion program to provide a basis for easy understanding of the automatic insertion program.

Figure 3:
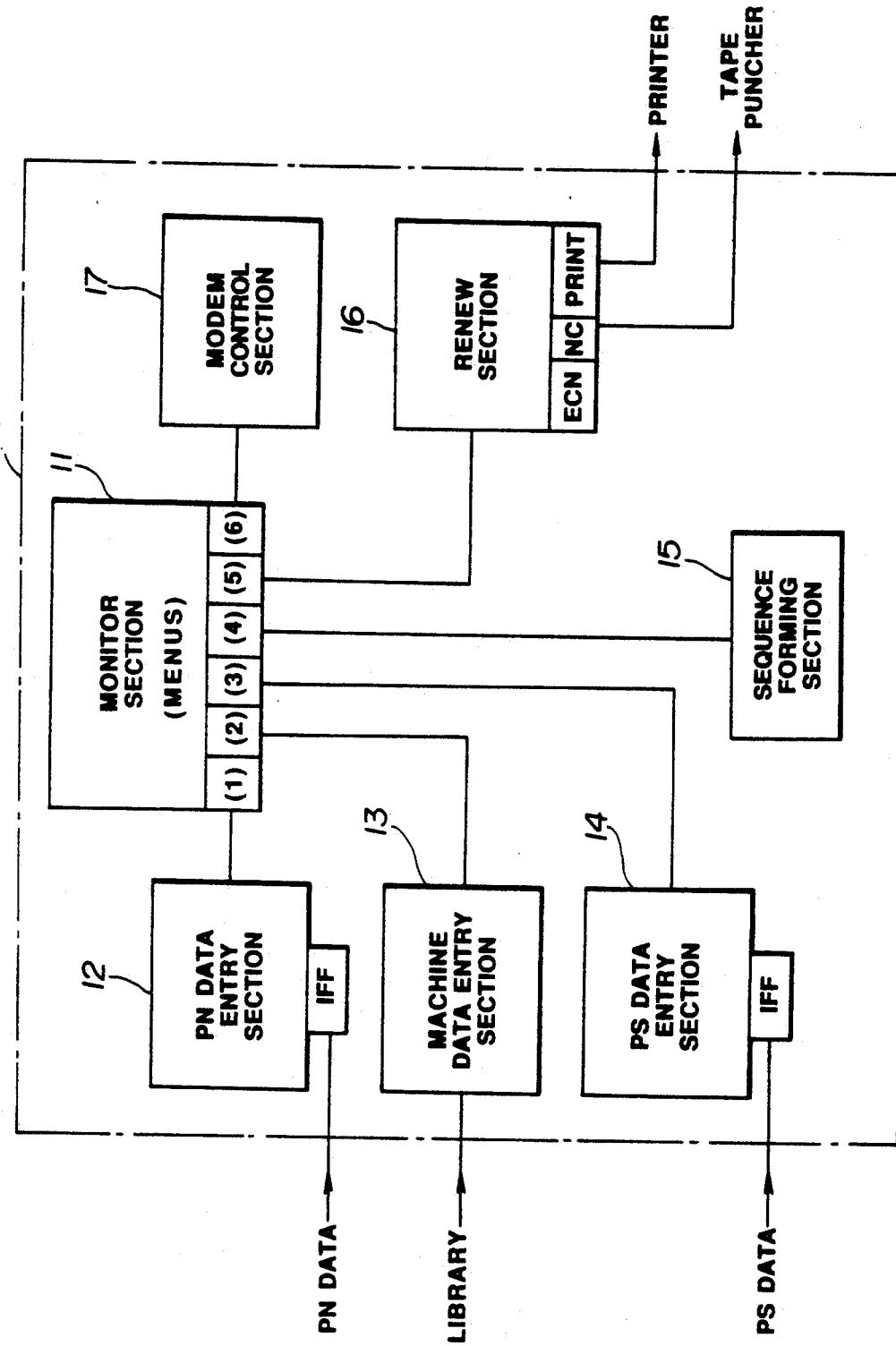
FIG. 3 is a schematic block diagram of the work station used in the apparatus for creating an automatic insertion program of FIG. 1.

Referring to FIG. 3, each of the work stations 1 includes a monitor section 11 used for an operator to produce commands to control the operation. The monitor section 11 displays a list of optional facilities or menus (1) through (6) which can be chosen by the operator in order to carry out different functions in the work station 1. The menus includes (1) PN data entry, (2) automatic insertion machine data entry, (3) PS data entry, (4) insertion sequence formation, (5) renew, and (6) modem control.

Each work station 1 also includes various sections 12, 13, 14, 15, 16 and 17 operable by selection of respective menus. When menu (1) is selected, the PN data entry section 12 operates to enter the PN data from the PN data memory section 3a of the data base 3 (FIG. 1) into the work station 1. Alternatively, the PN data may be entered into the work station 1 from a floppy disc having the PN data recorded thereon in the PLM system 8. When the PN data are entered directly from the PLM system 8 on a floppy disc into the work station 1, the data base 3 is updated automatically with the new PN data. The updated data then can be utilized in the other work stations 1. When the menu (2) is selected, the automatic insertion machine data entry section 13 operates to enter the automatic insertion machine data inherent to the automatic insertion machine 6 to be used from the library memory section 3c of the data base 3 (FIG. 1) into the work station 1. This menu selection permits the machine data regarding a new automatic insertion machine to be registered. The machine data are stored in the data base 3. The stored machine data are utilized in the other work stations 1. The PS data entry section 14 operates, in response to operator's selection of menu (3), to enter the PS data from the PS data memory section 3a of the data base 3 (FIG. 1) into the work station 1. Alternatively, the PS data may be entered into the work station 1 directly from a floppy disc having the PS data recorded thereon in the CAD system 7. When the PS data are entered directly from the CAD system 7 on a floppy disc into the work station 1, the data base 3 is updated automatically with the new PS data. The updated data then can be utilized in the other work stations 1.

The menu (4) is selected after the necessary data have been entered by the selection of menus (1) through (3). The insertion sequence forming section 15 corresponding to menu (4) operates to receive data regarding the order in which the automatic insertion machines 6 are used, to distribute electric parts to be inserted on the printed circuit board, and to automatically decide the order of insertion of the electric parts in each of the automatic insertion machines 6. Checks are made as to whether the dimensions of the electric parts specified by the PN data are in agreement with the dimensions specified by the PS data. The insertion sequence forming section 15 produces an indication if the dimensions specified by the PN data are not in agreement with the dimensions specified by the PS data. This checking function may be performed by the PN data and the PS data with the IFF data introduced into the data base 3 (FIG. 1). The electric parts are distributed to the cassettes of each of the automatic insertion machines and inserted on the printed circuit board in an order to provide a highest possible insertion efficiency without interference with the head of the automatic insertion machine. To provide a high insertion efficiency, it is desirable to minimize the range of motion of the cassettes. For example, the order in which electric parts are inserted is determined by setting the distance between the cassettes and the table on which the printed circuit board is fixedly supported to correspond to the range of movement of the cassettes within a machine cycle. Although a single cassette may hold only one kind of electric parts, it is preferable to put different electric parts into a single cassette when one electric part is inserted at a long distance from a position where another electric parts is inserted. In such cases, the electric parts may be combined in pairs. The order in which the pairs are inserted is predetermined to provide an optimum machine cycle.

The renew section 16 operates, in response to selection of menu (5), to process the data formed in the automatic insertion sequence forming section 15 based on commands from the operator. For this purpose, the renew section 16 has the following functions:

(1) Design Change (ECN)

This function includes parts elimination, parts addition and parts number change.

(2) Insertion Program Output (NC)

In response to an operator's command, the automatic insertion program is transferred directly to the automatic insertion machine 6, stored in a floppy disc, 1a or transferred to the tape puncher 5 (FIG. 1). Some automatic insertion machines can perform fine adjustment for printed circuit board dimension errors introduced in the course of production of the printed circuit board. The data regarding the adjustment are introduced through a data line to correct the position (X, Y) of insertion of the electric parts. The corrected position may be used in the other work stations 1.

(3) Print

The load plan (FIG. 2A), the store plan (FIG. 2B), the sequence list (FIG. 2C), and the check mask are printed by the printer 4 (FIG. 1).

The modem control section 17 operates when menu (6) is selected. The modem control section 17 supports the modem included in the server 2 (FIG. 1) and has directories specified by telephone numbers. When one of the directories is selected, the modem automatically transmits the locally produced data according to the schedule. This permits the use of the locally produced data in other factories.

Figure 4:
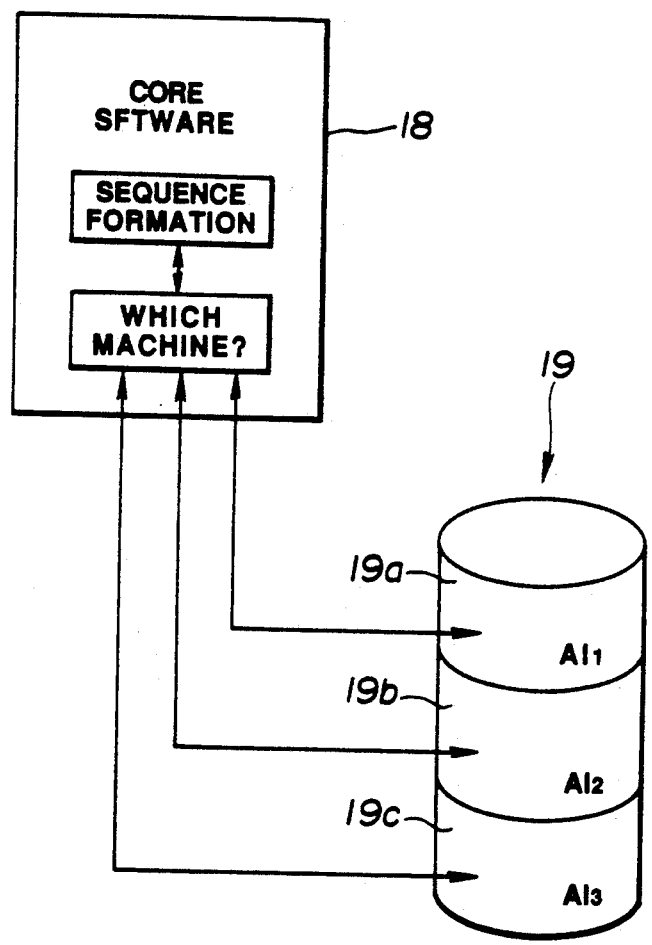
FIG. 4 is a schematic block diagram showing a software arrangement used in the invention.

FIG. 4 refers to the software arrangement (dynamic link software library) used in this embodiment to link the data inherent to each automatic insertion machine 6 in a library form. In FIG. 4, the numeral 18 designates a core software used commonly in the automatic insertion machines 6, and the numeral 19 designates libraries for the respective automatic insertion machines 6. The libraries 19 include a library 19a used for the automatic insertion machine $AI_1$, a library 19b used for the automatic insertion machine $AI_2$, a library 19c used for the automatic insertion machine $AI_3$. The libraries 19a, 19b and 19c have algorithms and machine data stored therein for use in forming automatic insertion sequences for the respective automatic insertion machines $AI_1$, $AI_2$ and $AI_3$. When an automatic insertion sequence is formed, the algorithm and machine data are linked in the core software 18. The data formed in this manner are returned to the core software 18 with the same format. Since the data inherent to each automatic insertion machine are separately stored in the respective libraries, it is possible to add a new type of automatic insertion machine merely by adding a new library to the library 19 without changing the core software 18.

Figure 5:
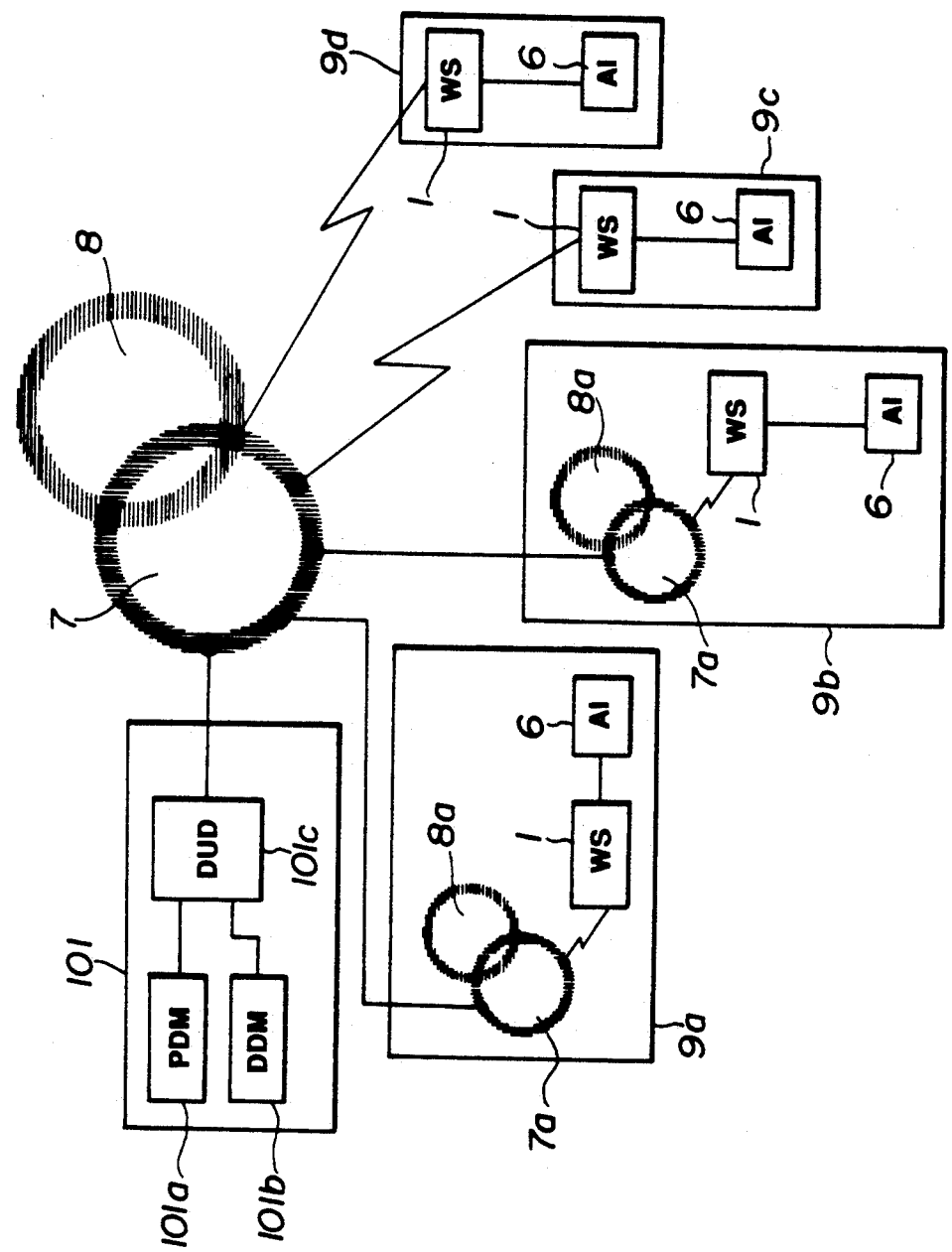
FIG. 5 is a schematic block diagram showing one example of network to which the invention is applicable.

Referring to FIG. 5, there is shown one example of a network to which the invention is applicable. The network includes large local stations 9a and 9b and small local stations 9c and 9d. The local stations are installed in different factories. Each of the large local stations 9a and 9b includes a local CAD (computer aided design) system 7a and a local PLM (parts list managing) system 8a. These systems 7a and 8a communicate with center CAD and PLM systems for transferring the IFF data to each other. In each of the large local stations 9a and 9b, the work station (WS) 1 receives the IFF data from the local CAD and PLM systems 7a and 8a and creates an automatic insertion program for controlling the automatic insertion machine (AI) 6 located in the station. In each of the small local stations 9c and 9d, the work station (WS) 1 receives the IFF data from the center CAD and PLM systems 7 and 8 through a modem and creates an automatic insertion program for controlling the automatic insertion machine (AI) 6 located in the station. The center CAD and PLM systems 7 and 8 are associated with an IFF support means 101 which includes a parts data maintenance means (PDM) 101a, a design data maintenance means (DDM) 101b and a data update means (DUD) 101c.

According to this invention, each of the work stations 1 can utilize the fundamental data (IFF data) stored in the data base 3 to create an automatic insertion program. The fundamental data include the CAD data regarding the printed circuit board and the PLM data regrading the electric parts to be inserted on the printed circuit board. The CAD data are transferred into the data base 3 from the CAD system 7 designing the printed circuit board, and the PLM data are transferred into the data base 3 from the PLM system 8 managing the arrangement and delivery of the electric parts. This eliminates the need to manually input the data. In addition, the fundamental data are managed in a centralized fashion and always checked to remove the possibility of mistaken data input. This eliminates the need to manually maintain the data base and check the manual data input. Furthermore, the automatic insertion program creating system can rapidly follow circuit board design changes and improve the performance of the automatic insertion machines.

The automatic insertion program is automatically created merely by the operation of a button. Although the conventional automatic insertion efficiency was 85% at most, the invention achieves 95% or more automatic insertion efficiency. Thus, the lead time, that is, the time interval between the time at which a new printed circuit board is delivered and the time at which production is started, can be reduced to several hours from the conventional lead time of 3 to 5 days. Because of the high automatic insertion efficiency, the time required to insert electric parts is shortened.

With the use of the automatic insertion program creating system of the present invention, an operator who is inexperienced in the field of automatic insertion production can still create an efficient automatic insertion program. In addition, all necessary documents can be obtained directly in the factories. The system is user-friendly and production-orientated. System changes can be made easily to accommodate new types of automatic insertion machine by utilizing the dynamic link software libraries.

Although the invention has been described in connection with an automatic insertion program creating system used for automatic insertion of electric parts on a printed circuit board, it is to be understood that the invention is equally applicable to automatic mounting of parts on an object including a printed circuit board. The invention is also applicable to control a system where robots are used to insert parts on an object. In addition, the invention can be used to indicate the steps of a manual mounting process or to transfer data to various testing machines.

Although this invention has been described in conjunction with a specific embodiment thereof, it is evident that many alternatives, modifications and variations will be apparent to those skilled in the art. Accordingly, it is intended to embrace all alternatives, modifications and variations that fall within the scope of the appended claim.

What is claimed is:

1. A control system for parts insertion machines, comprising:
   a plurality of parts insertion machines installed in local factories, said parts insertion machines being of different types and controlled with the aid of software which in part comprises core software common to each type of said plurality of parts insertion machines and in part comprises a plurality of special programs respectively applicable to different types of said parts insertion machines;
   a local computer in each local factory for directly controlling the respective parts insertion machines;
   a central computer installed in a control center;
   a parts list control system for supplying part data to said central computer;
   a CAD system for designing a printed circuit board and supplying CAD data to said central computer;
   library means for separately storing said core software and each of said special programs; and
   a communication network for connecting said central computer, said library means and each of said local computers through signal lines, whereby the parts insertion machines can be controlled automatically from said local computers or from said central computer.

* * * * *